(12) United States Patent
Lu et al.

(10) Patent No.: US 10,812,930 B1
(45) Date of Patent: Oct. 20, 2020

(54) POSITIONING SYSTEM AND POSITIONING METHOD BASED ON MAGNETIC FIELD INTENSITY

(71) Applicant: Osense Technology Co., Ltd., Taipei (TW)

(72) Inventors: Chao-Chuan Lu, Taipei (TW); You-Kwang Wang, Taipei (TW); Hung-Ya Tsai, Taipei (TW)

(73) Assignee: Osense Technology Co., Ltd., Taipei (TW)

( * ) Notice: Subject to any disclaimer, the term of this patent is extended or adjusted under 35 U.S.C. 154(b) by 0 days.

(21) Appl. No.: 16/735,661

(22) Filed: Jan. 6, 2020

(30) Foreign Application Priority Data

Nov. 22, 2019 (TW) .............................. 108142618 A

(51) Int. Cl.
*H04W 24/00* (2009.01)
*H04W 4/02* (2018.01)
*G01R 33/10* (2006.01)
*H04W 4/33* (2018.01)

(52) U.S. Cl.
CPC .............. *H04W 4/02* (2013.01); *G01R 33/10* (2013.01); *H04W 4/33* (2018.02)

(58) Field of Classification Search
CPC ........... H04W 4/02; H04W 4/33; G01R 33/10

USPC ...................................................... 455/456.1
See application file for complete search history.

(56) References Cited

U.S. PATENT DOCUMENTS

| 9,146,113 | B1 | 9/2015 | Funk et al. |
| 9,476,717 | B2 | 10/2016 | Haverinen et al. |
| 9,995,564 | B2* | 6/2018 | Kim .......................... G01B 7/14 |
| 10,075,935 | B1 | 9/2018 | Bavand et al. |
| 10,205,819 | B2* | 2/2019 | Hannon .................... G01S 5/30 |
| 2018/0274931 | A1 | 9/2018 | Noethlings et al. |

FOREIGN PATENT DOCUMENTS

| TW | 201623997 | 7/2016 |
| TW | M530957 | 10/2016 |
| TW | I608243 | 12/2017 |
| TW | I642962 | 12/2018 |

* cited by examiner

Primary Examiner — Amancio Gonzalez
(74) Attorney, Agent, or Firm — JCIPRNET

(57) ABSTRACT

A positioning system and a positioning method based on magnetic field intensity are provided. The positioning method includes: storing a magnetic fingerprint of a first place; sensing, by a mobile terminal, a magnetic field of the first place to generate sensed data; determining whether the mobile terminal is located inside or outside a vehicle according to the sensed data and the magnetic fingerprint; determining that the mobile terminal is located at a first location of the first place according to the sensed data and the magnetic fingerprint.

10 Claims, 5 Drawing Sheets

POSITIONING SYSTEM AND POSITIONING METHOD BASED ON MAGNETIC FIELD INTENSITY

CROSS-REFERENCE TO RELATED APPLICATION

This application claims the priority benefit of Taiwan patent application serial no. 108142618, filed on Nov. 22, 2019. The entirety of the above-mentioned patent application is hereby incorporated by reference herein and made a part of this specification.

BACKGROUND

Technical Field

The disclosure relates to a positioning system and a positioning method; more particularly, the disclosure relates to a positioning system and a positioning method based on magnetic field intensity.

Description of Related Art

In conventional positioning methods, a global positioning system (GPS) is often applied to detect a location of a vehicle or a pedestrian. Specifically, the vehicle or the pedestrian may carry a positioning device with a function of receiving GPS signals, and the positioning device may receive the GPS signals from different satellites and calculate the location of the vehicle or the pedestrian according to the received GPS signals. However, when the vehicles or the pedestrians is located indoors, the GPS signals may be blocked by buildings, whereby the positioning device is not able to receive the GPS signals. Therefore, the GPS system is not an ideal solution to positioning.

SUMMARY

The disclosure provides a positioning system and a positioning method based on magnetic field intensity, which may accurately locate indoor objects.

According to an embodiment of the disclosure, a positioning system based on the magnetic field intensity includes a server and a mobile terminal. The server stores a magnetic fingerprint of a first place. The mobile terminal communicates with the server, senses a magnetic field of the first place to generate sensed data, and uploads the sensed data to the server. The server determines whether the mobile terminal is located inside or outside a vehicle and determines that the mobile terminal is located at a first location of the first place according to the sensed data and magnetic fingerprint.

In an embodiment of the disclosure, the positioning system further includes a second mobile terminal communicating with the server. According to a first path in the first place, the second mobile terminal measures positioning information, first sensed data, and second sensed data corresponding to the first path, and uploads the positioning information, the first sensed data, and the second sensed data to the server. Here, the first sensed data are associated with the first magnetic field corresponding to the vehicle, and the second sensed data are associated with the second magnetic field corresponding to a pedestrian.

In an embodiment of the disclosure, the server establishes the magnetic fingerprint according to the positioning information, the first sensed data, and the second sensed data.

In an embodiment of the disclosure, the server calculates an offset value according to the first sensed data and the second sensed data and establishes the magnetic fingerprint according to the first sensed data and the offset value.

In an embodiment of the disclosure, the server calculates an offset value according to the first sensed data and the second sensed data and determines whether the mobile terminal is located inside or outside the vehicle according to the offset value and the sensed data.

In an embodiment of the disclosure, the positioning information is associated with one of a global positioning system (GPS) and an inertial measurement unit (IMU).

According to an embodiment of the disclosure, a positioning method based on magnetic field intensity includes: storing a magnetic fingerprint of a first place; sensing, by a mobile terminal, a magnetic field of the first place to generate sensed data; according to the sensed data and the magnetic fingerprint, determining whether the mobile terminal is located inside or outside a vehicle; determining that the mobile terminal is located at a first location of the first place according to the sensed data and the magnetic fingerprint.

In an embodiment of the disclosure, the positioning method further includes:
 according to a first path, measuring positioning information, first sensed data, and second sensed data corresponding to the first path, wherein the first sensed data are associated with the first magnetic field corresponding to the vehicle, and the second sensed data are associated with the second magnetic field corresponding to a pedestrian.

In an embodiment of the disclosure, the positioning method further includes:
 establishing the magnetic fingerprint according to the positioning information, the first sensed data, and the second sensed data.

In an embodiment of the disclosure, the positioning method further includes:
 calculating an offset value according to the first sensed data and the second sensed data and establishing the magnetic fingerprint according to the first sensed data and the offset value.

In an embodiment of the disclosure, the positioning method further includes:
 calculating an offset value according to the first sensed data and the second sensed data and determining whether the mobile terminal is located inside or outside the vehicle according to the offset value and the sensed data.

In an embodiment of the disclosure, the positioning information is associated with one of a GPS and an IMU.

In view of the foregoing, the server provided in one or more embodiments of the disclosure may position the mobile terminal according to the sensed data of the magnetic field from the mobile terminal. In addition, the server may also determine whether the mobile terminal is located inside or outside the vehicle, thereby improving the inaccurate positioning due to the influence of the vehicle on the sensed data of the magnetic field.

In order to make the aforementioned advantages of the disclosure comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1:
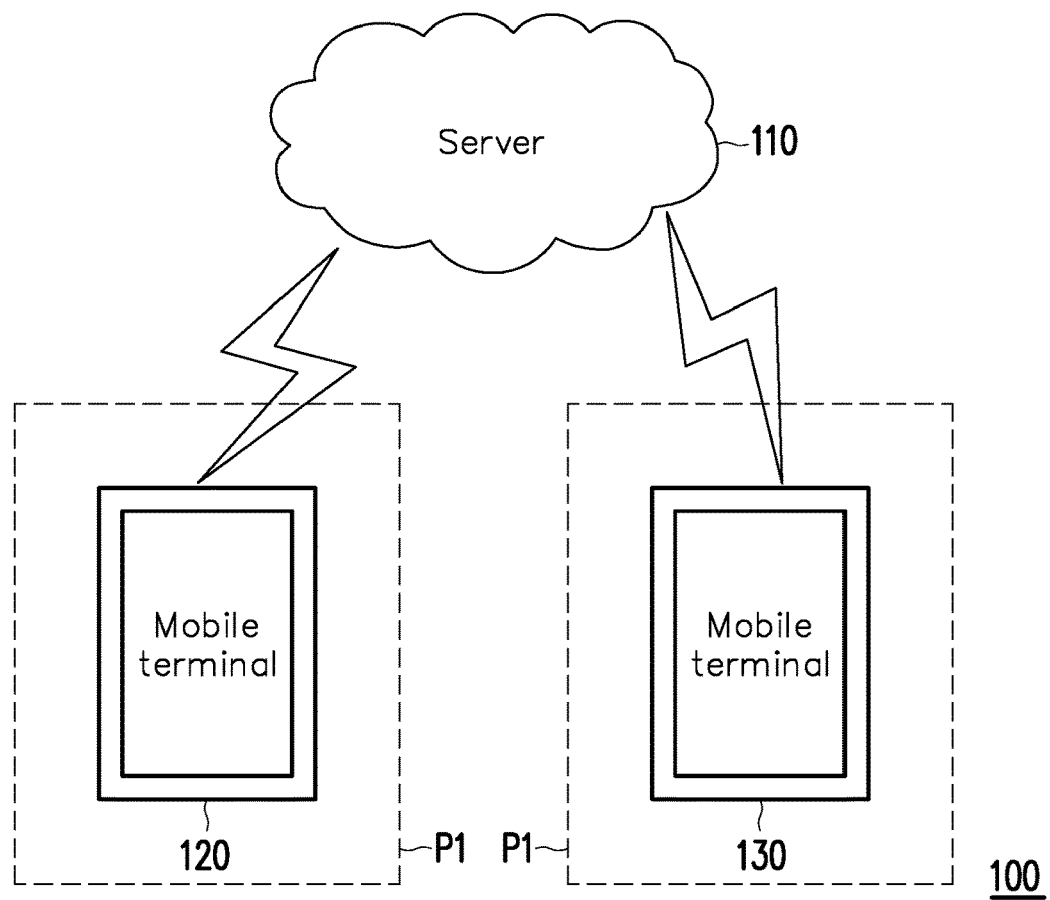
FIG. 1 is a schematic diagram of a positioning system based on magnetic field intensity according to an embodiment of the disclosure.

Reference will now be made in detail to the embodiments of the disclosure, and examples of the embodiments will be described in the drawings. In addition, wherever possible, the same reference numbers are used in the drawings and embodiments to represent the same or similar parts.

FIG. 1 is a schematic diagram of a positioning system 100 based on magnetic field intensity according to an embodiment of the disclosure. The positioning system 100 includes a server 110 and a mobile terminal 120 for positioning, wherein the mobile terminal 120 communicates with the server 110. In some embodiments, the positioning system 100 further includes a mobile terminal 130 for collecting data associated with a magnetic fingerprint, wherein the mobile terminal 130 communicates with the server 110.

The positioning system 100 is configured to position the mobile terminal 120 (or mobile terminal 130). Specifically, when the mobile terminal 120 (or the mobile terminal 130) enters a place P1, the positioning system 100 determines the location of the mobile terminal 120 (or the mobile terminal 130) in the place P1 according to the sensed data of a magnetic field associated with the place P1 and generated by the mobile terminal 120 (or the mobile terminal 130), wherein the place P1 may be an indoor place.

Figure 2:
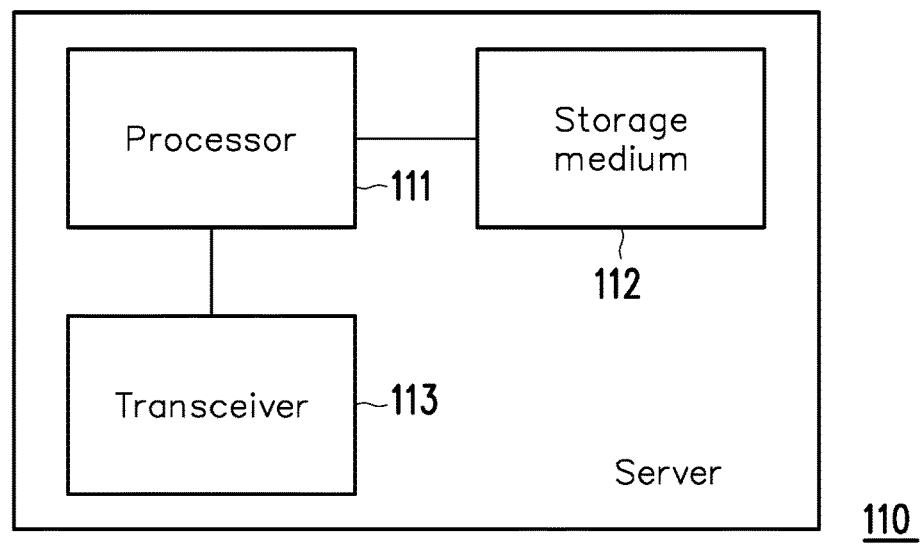
FIG. 2 is a schematic diagram of a server according to an embodiment of the disclosure.

FIG. 2 is a schematic diagram of the server 110 according to an embodiment of the disclosure. The server 110 is, for instance, a cloud server, which should however not be construed as a limitation in the disclosure. The server 110 includes a processor 111, a storage medium 112, and a transceiver 113.

The processor 111 is coupled to the storage medium 112 and the transceiver 113. The processor 111 is, for instance, a central processing unit (CPU) or another programmable micro control unit (MCU), microprocessor, digital signal processor (DSP), programmable controller, application specific integrated circuit (ASIC), graphics processing unit (GPU), arithmetic logic unit (ALU), complex programmable logic device (CPLD), field programmable gate array (FPGA), another similar component, or a combination of the above.

The storage medium 112 may be of any type and may be, for instance, a fixed or movable random access memory (RAM), read only memory (ROM), flash memory, hard disk drive (HDD), solid state drive (SSD), another similar component, or a combination of the above, and the storage medium 112 is configured to store a plurality of modules or various applications which may be executed by the processor 111. After the server 110 establishes a magnetic fingerprint of a place (for instance, the place P1 shown in FIG. 1), the storage medium 112 may store the magnetic fingerprint.

The transceiver 113 transmits or receives signals in a wireless manner. The transceiver 113 may also perform operations including low noise amplification, impedance matching, frequency mixing, up or down frequency conversion, filtering, amplification, and the like.

Figure 3:
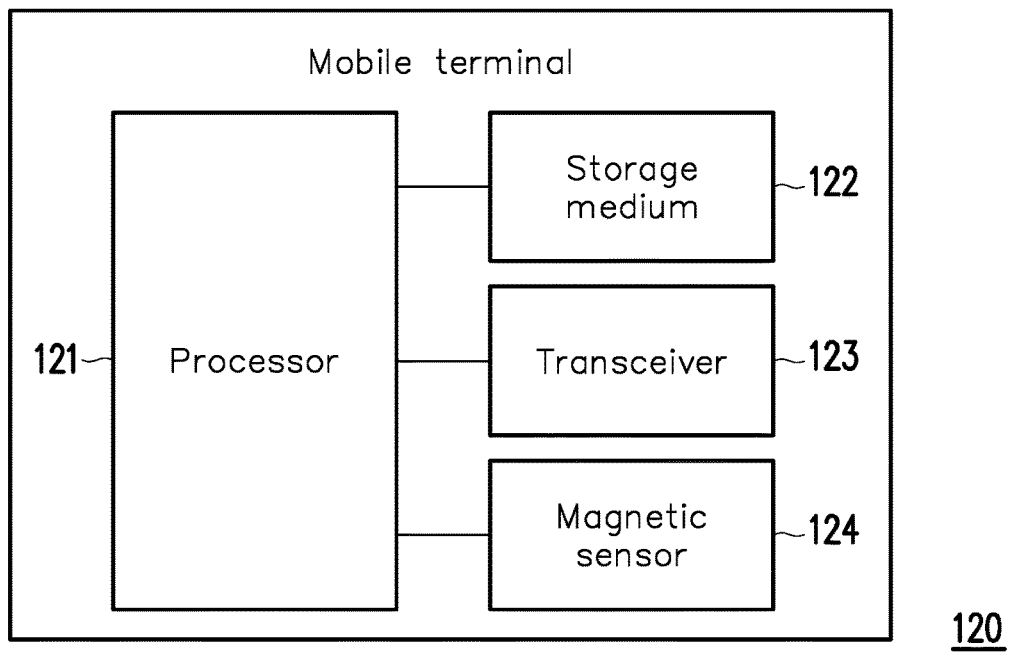
FIG. 3 is a schematic diagram a mobile terminal for positioning according to an embodiment of the disclosure.

FIG. 3 is a schematic diagram the mobile terminal 120 for positioning according to an embodiment of the disclosure. The mobile terminal 120 includes a processor 121, a storage medium 122, a transceiver 123, and a magnetic sensor 124.

The processor 121 is coupled to the storage medium 122, the transceiver 123, and the magnetic sensor 124. The processor 121 is, for instance, a CPU or another programmable general-purpose or special-purpose MCU, microprocessor, DSP, programmable controller, ASIC, GPU, ALU, CPLD, FPGA, another similar component, or a combination of the above.

The storage medium 122 may be of any type and may be, for instance, a fixed or movable RAM, ROM, flash memory, HDD, SSD, another similar component, or a combination of the above, and the storage medium 122 is configured to store a plurality of modules or various applications which may be executed by processor 121.

The transceiver 123 transmits or receives signals in a wireless manner. The transceiver 123 may also perform operations including low noise amplification, impedance matching, frequency mixing, up or down frequency conversion, filtering, amplification, and the like.

The magnetic sensor 124 is configured to sense the magnetic field near the mobile terminal 120 to generate corresponding sensed data. For instance, if the mobile terminal 120 moves along a specific path in the place P1, the magnetic sensor 124 may sense the magnetic field nearby to generate sensed data corresponding to the specific path in the place P1.

Figure 4:
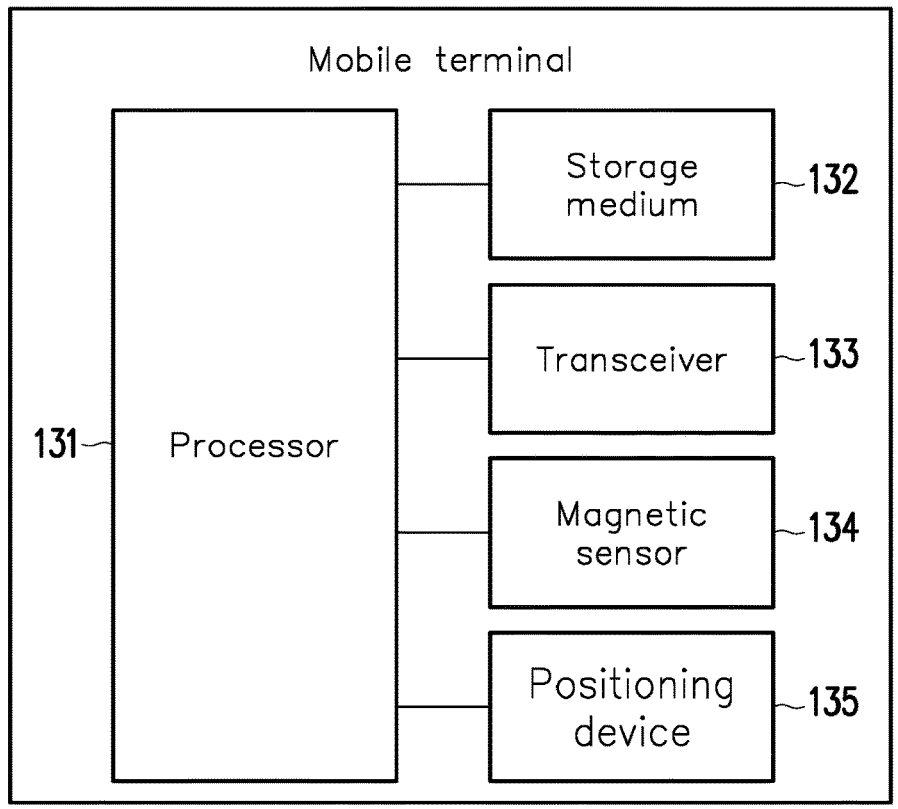
FIG. 4 is a schematic diagram of a mobile terminal for collecting data associated with a magnetic fingerprint according to an embodiment of the disclosure.

FIG. 4 is a schematic diagram of the mobile terminal 130 for collecting data associated with a magnetic fingerprint according to an embodiment of the disclosure. The mobile terminal 130 includes a processor 131, a storage medium 132, a transceiver 133, a magnetic sensor 134, and a positioning device 135.

The processor 131 is coupled to the storage medium 132, the transceiver 133, the magnetic sensor 134, and the positioning device 135. The processor 131 is, for instance, a CPU or another programmable general-purpose or special-purpose MCU, microprocessor, DSP, programmable controller, ASIC, GPU, ALU, CPLD, FPGA, another similar component, or a combination of the above The storage medium 132 may be of any type and may be, for instance, a fixed or movable RAM, ROM, flash memory, HDD, SSD, another similar component, or a combination of the above, and the storage medium 132 is configured to store a plurality of modules or various applications which may be executed by processor 131.

The transceiver 133 transmits or receives signals in a wireless manner. The transceiver 133 may also perform operations including low noise amplification, impedance matching, frequency mixing, up or down frequency conversion, filtering, amplification, and the like.

The magnetic sensor 134 is configured to sense the magnetic field near the mobile terminal 130 to generate corresponding sensed data. For instance, if the mobile terminal 130 moves along a specific path in the place P1, the magnetic sensor 134 may sense the magnetic field nearby to generate sensed data corresponding to the specific path in the place P1.

The positioning device 135 is, for instance, a GPS device or an IMU, which should not be construed as a limitation in the disclosure. The positioning device 135 is, for instance, any positioning device that is not based on magnetic field intensity. The positioning device 135 is configured to collect positioning information of a place (e.g., the place P1). For instance, if the positioning device 135 is the GPS device, the positioning information refers to data associated with latitude and longitude. If the positioning device 135 is the IMU, the positioning information refers to data associated with angular speed and/or acceleration.

Figure 5:
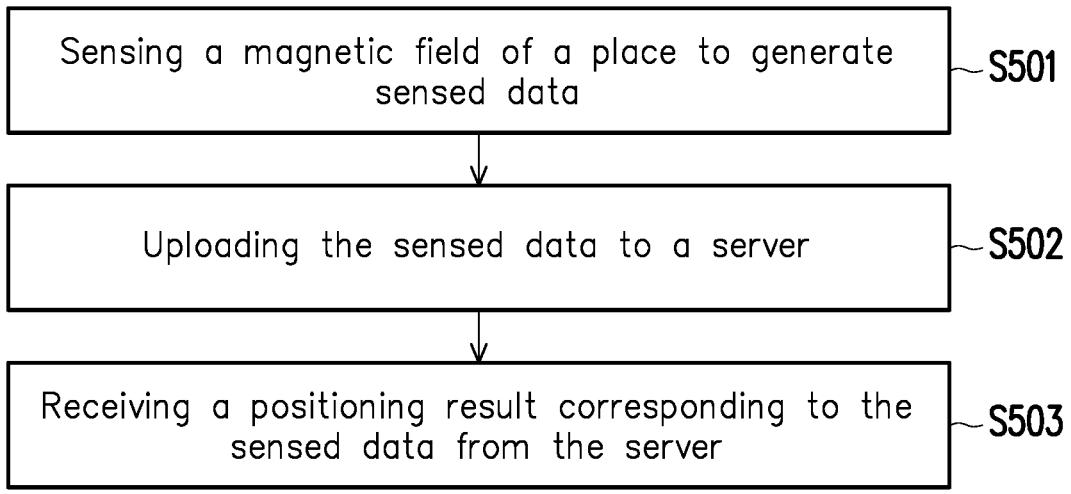
FIG. 5 is a flowchart of a positioning method adapted to a mobile terminal according to an embodiment of the disclosure.

FIG. 5 is a flowchart of a positioning method adapted to a mobile terminal 120 according to an embodiment of the disclosure. In step S501, the mobile terminal 120 uses the magnetic sensor 124 to sense the magnetic field of the place P1 to generate the sensed data. In step S502, the mobile terminal 120 uses the transceiver 123 to upload the sensed data to the server 110. In step S503, the mobile terminal 120 uses the transceiver 123 to receive a positioning result corresponding to the sensed data from the server 110, wherein the positioning result indicates the location of the mobile terminal 120 in the place P1. The server 110 may determine whether the mobile terminal 120 is located inside or outside a vehicle according to the sensed data uploaded by the mobile terminal 120, so as to improve the accuracy of the positioning result according to the determination.

Note that the positioning method shown in FIG. 5 may also be applied by the mobile terminal 130. In some embodiments of the disclosure, the mobile terminal 130 may perform positioning and collect data associated with the magnetic fingerprint of the place P1 at the same time.

Figure 6:
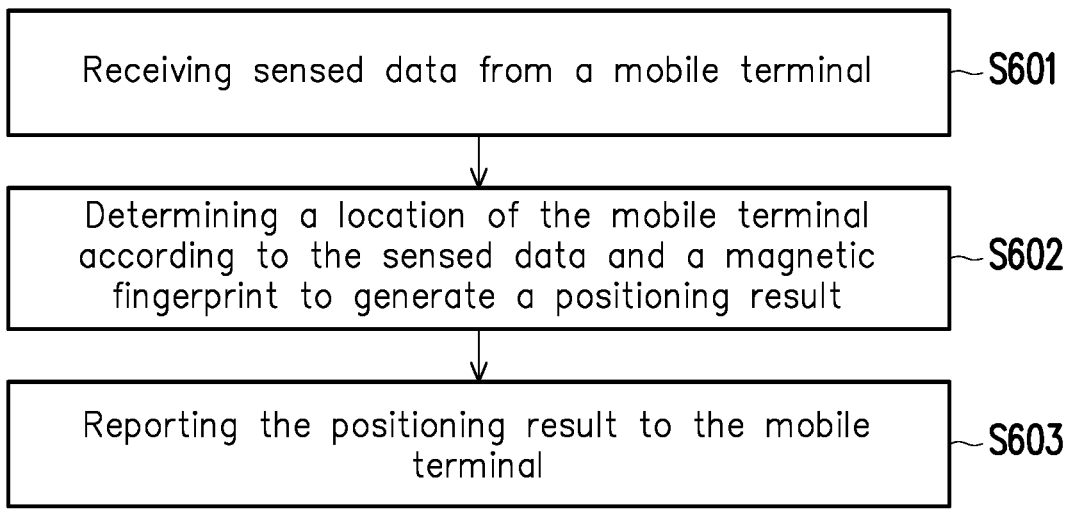
FIG. 6 is a flowchart of a positioning method adapted to a server according to an embodiment of the disclosure.

FIG. 6 is a flowchart of a positioning method adapted to a server 110 according to an embodiment of the disclosure.

In step S601, the server 110 uses the transceiver 113 to receive the sensed data from the mobile terminal 120.

In step S602, the server 110 determines the location of the mobile terminal 120 according to the sensed data and the magnetic fingerprint to generate a positioning result. Specifically, the processor 111 of the server 110 may compare the sensed data with a plurality of magnetic fingerprints which are stored in the storage medium 112 and correspond to different places, and in response to a result of matching the sensed data to the magnetic fingerprint of the place P1, the location of the mobile terminal 120 in the place P1 may be determined. In some embodiments of the disclosure, the server 110 may further determine whether the mobile terminal 120 is located inside or outside the vehicle, so as to correct the positioning result according to the determination. For instance, when the mobile terminal 120 is located inside the vehicle, the magnetic field intensity received by the magnetic sensor 124 is low. If the magnetic fingerprint of the place P1 corresponds to the magnetic field intensity of the place P1 measured outside the vehicle, the magnetic field intensity of the sensed data transmitted by mobile terminal 120 is lower than the magnetic fingerprint of the place P1 by an offset value (hereinafter referred to as "the offset value TH"). The processor 111 of the server 110 may determine that the mobile terminal 120 is located inside the vehicle based on the fact that the difference obtained by subtracting the magnetic field intensity of the sensed data from the mobile terminal 120 from the magnetic field intensity of the magnetic fingerprint of the place P1 is similar to the offset value TH.

In an embodiment of the disclosure, the processor 111 may improve the accuracy of the positioning result based on the fact that the mobile terminal 120 is located inside or outside the vehicle. For instance, after the processor 111 determines that the mobile terminal 120 is located inside the vehicle, the processor 111 may correct the sensed data from the mobile terminal 120 according to an offset value (for instance, adding the offset value TH to the magnetic field intensity of the sensed data) to generate corrected sensed data. The processor 111 may compare the corrected sensed data and the magnetic fingerprint of the place P1 to determine the location of the mobile terminal 120 in the place P1, so as to generate a positioning result.

In step S603, the server 110 uses the transceiver 113 to report the positioning result to the mobile terminal 120.

Figure 7:
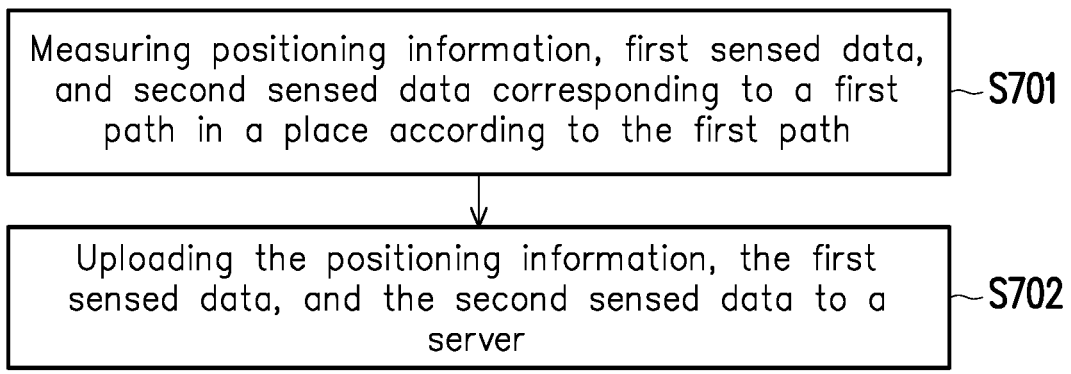
FIG. 7 is a flowchart of a method of establishing a magnetic fingerprint adapted to a mobile terminal according to an embodiment of the disclosure.

FIG. 7 is a flowchart of a method of establishing a magnetic fingerprint adapted to a mobile terminal 130 according to an embodiment of the disclosure.

In step S701, the mobile terminal 130 uses the magnetic sensor 134 and the positioning device 135 to measure positioning information, first sensed data, and second sensed data corresponding to a first path in the place P1 according to the first path, the first sensed data are associated with the magnetic field corresponding to the vehicle, and the second sensed data are associated with the magnetic field corresponding to a pedestrian. For instance, the user may place the mobile terminal 130 in the vehicle. The vehicle may move along the first path, so that the magnetic sensor 134 may sense the magnetic field of the first path, thereby generating the first sensed data corresponding to the vehicle. On the other hand, the user may carry the mobile terminal 130 with him or her and may walk along the first path, so that the magnetic sensor 134 may sense the magnetic field of the first path, thereby generating the second sensed data corresponding to the pedestrian. In addition to sensing information related to the magnetic field, the mobile terminal 130 also uses the positioning device 135 to measure the positioning information corresponding to the first path. The positioning information may be associated with latitude, longitude, angular speed, and/or acceleration, which should however not be construed as a limitation in the disclosure.

In step S702, the mobile terminal 130 uploads the positioning information, the first sensed data, and the second sensed data to the server 110.

Figure 8:
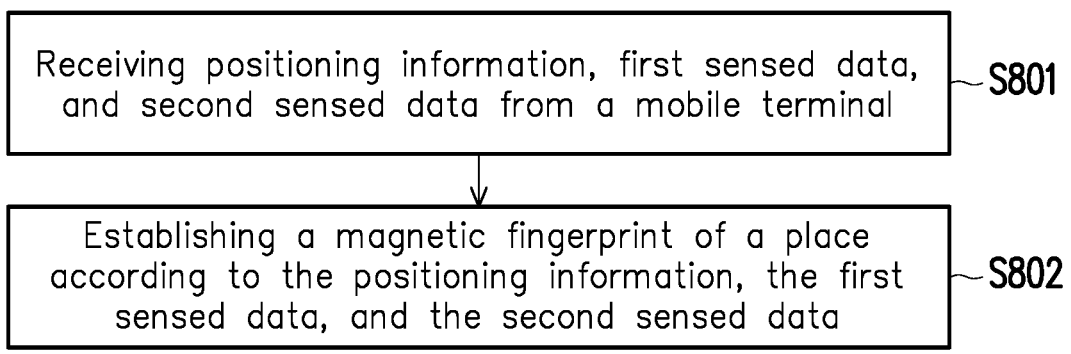
FIG. 8 is a flowchart of a method of establishing a magnetic fingerprint adapted to a server according to an embodiment of the disclosure.

FIG. 8 is a flowchart of a method of establishing a magnetic fingerprint adapted to the server 110 according to an embodiment of the disclosure.

In step S801, the server 110 uses the transceiver 113 to receive the positioning information, the first sensed data, and the second sensed data from the mobile terminal 130.

In step S802, the processor 111 of the server 110 establishes the magnetic fingerprint of the place P1 according to the positioning information, the first sensed data, and the second sensed data. Specifically, the processor 111 may calculate an offset value (i.e., the offset value TH) according to the first sensed data and the second sensed data, and the offset value TH indicates the difference between the magnetic field intensity measured inside the vehicle and the magnetic field intensity measured outside the vehicle. For instance, the processor 111 may subtract the magnetic field intensity of the first sensed data from the magnetic field intensity of the second sensed data to generate the offset value TH.

After calculating the offset value TH, the processor 111 may establish the magnetic fingerprint corresponding to the place P1 according to the first sensed data and the offset value TH. For instance, the processor 111 may add the offset value TH to the magnetic field intensity of the first sensed data to establish the magnetic fingerprint corresponding to the place P1.

Figure 9:
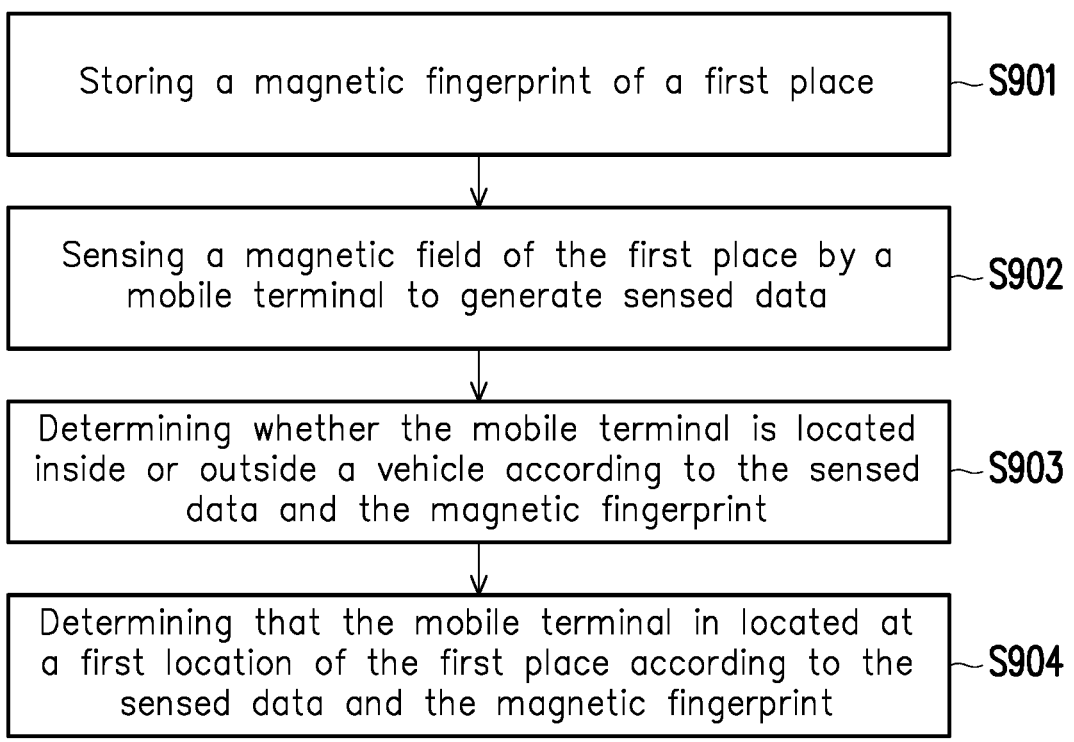
FIG. 9 is a flowchart of a positioning method based on magnetic field intensity according to an embodiment of the disclosure.

FIG. 9 is a flowchart of a positioning method based on magnetic field intensity according to an embodiment of the disclosure, wherein the positioning method may be implemented by the positioning system 100 as shown in FIG. 1. In step S901, the magnetic fingerprint of the first place is stored by the server 110. In step S902, the magnetic field of the first place is sensed by the mobile terminal 120 to generate the sensed data. In step S903, the server 110 determines whether the mobile terminal 120 is located inside or outside the vehicle according to the sensed data and the magnetic fingerprint. In step S904, the server 110 determines that the mobile terminal 120 is located at the first location of the first place according to the sensed data and the magnetic fingerprint.

To sum up, the server provided in one or more embodiments of the disclosure may establish the magnetic fingerprint of an indoor place according to the positioning information collected by the mobile terminal and the sensed data corresponding to the magnetic field. After that, when the vehicle or the pedestrian carrying the mobile terminal enters the place, the server may compare the sensed data transmitted by the mobile terminal with the magnetic fingerprint of the place to determine the location of the mobile terminal. When the user determines a location through the mobile terminal, the sensed data transmitted to the server by the mobile terminal may also help the server update the magnetic fingerprint of the place. In addition, when determining the location of the mobile terminal, the server may determine whether the mobile terminal is located inside the vehicle, thereby improving the inaccurate positioning due to the influence of the vehicle on the sensed data of the magnetic field.

Although the disclosure has been disclosed in the above embodiments, it is not intended to limit the disclosure, and any one of ordinary skill in the art will be able to make some modifications and refinements without departing from the spirit and scope of the disclosure. The scope of the disclosure is defined by the scope of the appended claims.

What is claimed is:

1. A positioning system based on magnetic field intensity, the positioning system comprising:
   a server storing a magnetic fingerprint of a first place;
   a mobile terminal communicating with the server, sensing a magnetic field of the first place to generate sensed data, and uploading the sensed data to the server; and
   a second mobile terminal communicating with the server, measuring positioning information, first sensed data, and second sensed data corresponding to a first path in the first place according to the first path, and uploading the positioning information, the first sensed data, and the second sensed data to the server, wherein according to the sensed data and the magnetic fingerprint, the server determines whether the mobile terminal is located inside or outside a vehicle and determines that the mobile terminal is located at a first location of the first place, and
   the first sensed data are associated with a first magnetic field corresponding to the vehicle, and the second sensed data are associated with a second magnetic field corresponding to a pedestrian.

2. The positioning system according to claim 1 wherein the server establishes the magnetic fingerprint according to the positioning information, the first sensed data, and the second sensed data.

3. The positioning system according to claim 2, wherein the server calculates an offset value according to the first sensed data and the second sensed data and establishes the magnetic fingerprint according to the first sensed data and the offset value.

4. The positioning system according to claim 1, wherein the server calculates an offset value according to the first sensed data and the second sensed data and determines whether the mobile terminal is located inside or outside the vehicle according to the offset value and the sensed data.

5. The positioning system according to claim 1, wherein the positioning information is associated with one of a global positioning system and an inertial measurement unit.

6. A positioning method based on magnetic field intensity, the positioning method comprising:
   storing a magnetic fingerprint of a first place;
   sensing a magnetic field of the first place by a mobile terminal to generate sensed data;
   determining whether the mobile terminal is located inside or outside a vehicle according to the sensed data and the magnetic fingerprint;
   determining that the mobile terminal is located at a first location of the first place according to the sensed data and the magnetic fingerprint; and
   according to a first path, measuring positioning information, first sensed data, and second sensed data corresponding to the first path, wherein the first sensed data are associated with a first magnetic field corresponding to the vehicle, and the second sensed data are associated with a second magnetic field corresponding to a pedestrian.

7. The positioning method according to claim 6, further comprising: establishing the magnetic fingerprint according to the positioning information, the first sensed data, and the second sensed data.

8. The positioning method according to claim 7, further comprising:
   calculating an offset value according to the first sensed data and the second sensed data; and
   establishing the magnetic fingerprint according to the first sensed data and the offset value.

9. The positioning method according to claim 6, further comprising: calculating an offset value according to the first sensed data and the second sensed data; and determining that the mobile terminal is located inside or outside the vehicle according to the offset value and the sensed data.

10. The positioning method according to claim 6, wherein the positioning information is associated with one of a global positioning system and an inertial measurement unit.

* * * * *